US008645893B1

(12) United States Patent
Yeung et al.

(10) Patent No.: US 8,645,893 B1
(45) Date of Patent: Feb. 4, 2014

(54) METHOD OF GENERATING A LAYOUT OF AN INTEGRATED CIRCUIT COMPRISING BOTH STANDARD CELLS AND AT LEAST ONE MEMORY INSTANCE

(71) Applicant: ARM Limited, Cambridge (GB)

(72) Inventors: Gus Yeung, Austin, TX (US); Martin Jay Kinkade, Austin, TX (US); Marlin Wayne Frederick, Jr., Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/658,072

(22) Filed: Oct. 23, 2012

(51) Int. Cl.
*G06F 17/50* (2006.01)
(52) U.S. Cl.
USPC .............................. 716/135; 716/119; 716/122
(58) Field of Classification Search
None
See application file for complete search history.

(56) References Cited

U.S. PATENT DOCUMENTS

| 6,925,627 B1 * | 8/2005 | Longway et al. | 257/207 |
| 7,478,358 B2 * | 1/2009 | Fujimoto | 716/138 |
| 8,136,072 B2 * | 3/2012 | Frederick | 716/119 |
| 2012/0209888 A1 * | 8/2012 | Chung | 707/802 |

* cited by examiner

*Primary Examiner* — Leigh Garbowski
(74) *Attorney, Agent, or Firm* — Nixon & Vanderhye P.C.

(57) ABSTRACT

A method of generating a layout of an integrated circuit is disclosed, the layout incorporating both standard cells and at least one memory instance generated by a memory compiler to define a memory device of the integrated circuit. Input data is received specifying one or more properties of a desired memory instance. The memory compiler generates the desired memory instance based on the input data and using the specified memory architecture. A standard cell library is provided. The memory compiler references at least one property of the standard cell library in order to generate the desired memory instance. The layout is then generated by populating standard cell rows with standard cells selected from the standard cell library in order to provide the functional components required by the integrated circuit, and integrating into the layout the desired memory instance provided by the memory compiler.

16 Claims, 11 Drawing Sheets

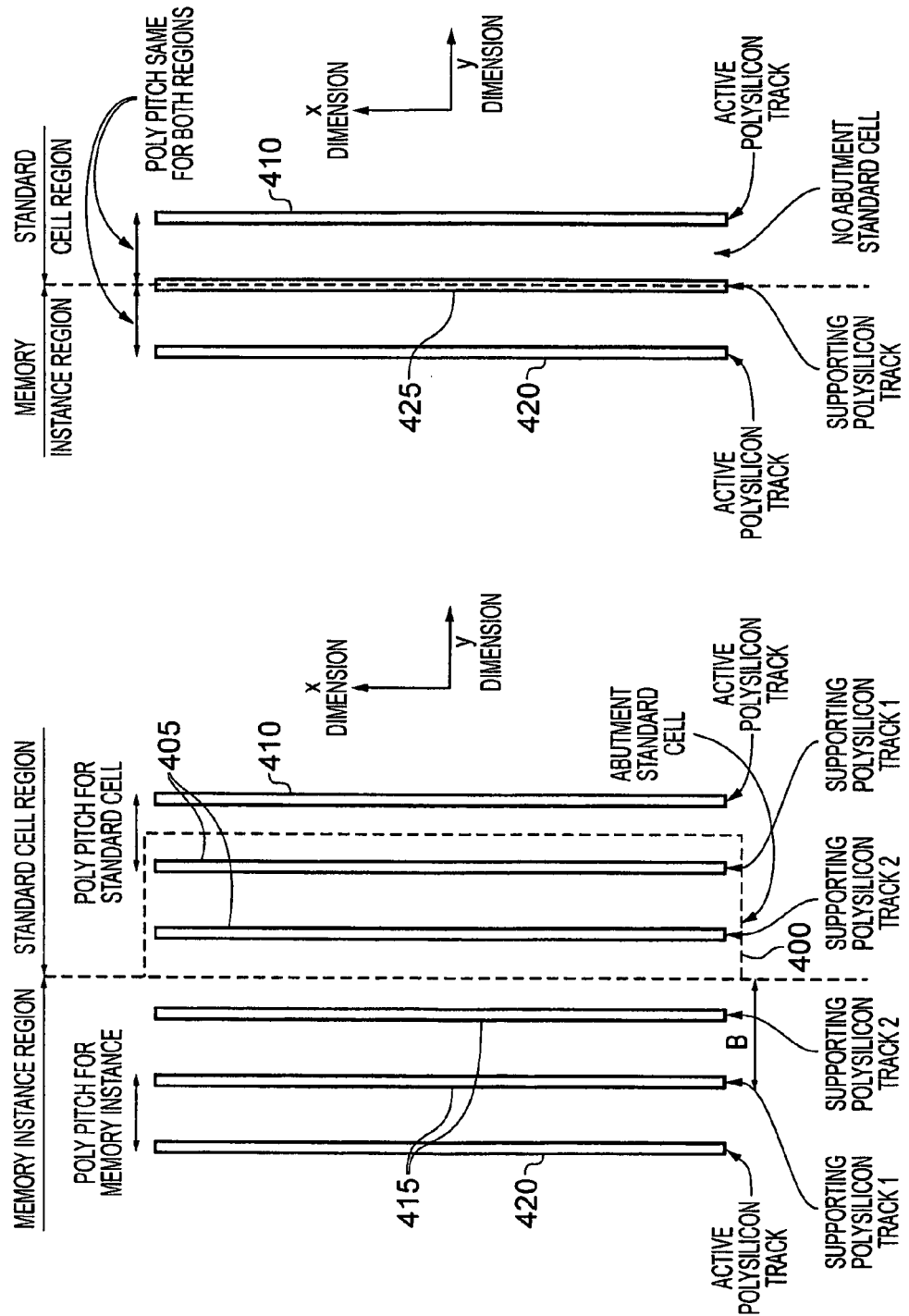

METHOD OF GENERATING A LAYOUT OF AN INTEGRATED CIRCUIT COMPRISING BOTH STANDARD CELLS AND AT LEAST ONE MEMORY INSTANCE

BACKGROUND OF THE INVENTION

1. Field of the Invention

The present invention relates to a technique for generating a layout of an integrated circuit, where the layout incorporates both standard cells defining functional components of the integrated circuit and at least one memory instance generated by a memory compiler to define a memory device of the integrated circuit.

2. Description of the Prior Art

It is becoming more and more common for integrated circuits to include on-chip memory devices, a particular example being where the integrated circuit provides a System-on-Chip (SoC).

When designing memory devices, there are two general approaches that can be taken. In accordance with a first approach, the memory device can be custom designed for a particular implementation, which may lead to an efficient design. However, the disadvantage of such an approach is that there is little chance of re-using that design in different implementations, and accordingly such an approach is costly. In accordance with an alternative approach, a memory architecture is developed specifying a definition of circuit elements and data defining rules for combining those circuit elements, and then a memory compiler tool is used to create a memory instance (i.e. a particular instantiation) of that memory architecture to form the design of a required memory device having regard to some specified properties of that memory device. This latter approach of using a memory compiler tool to generate a memory instance is nowadays a very popular technique, since once the memory architecture is defined, a wide variety of different instances of a memory device can be readily generated, having regards to the requirements of the memory device in any particular system.

Accordingly, when designing SoCs including one or more on-chip memory devices, it is typically the case that the required memory instance(s) will be generated by a memory compiler, with each generated memory instance then being provided to a place and route tool used to generate the layout of the integrated circuit.

The place and route tool is an automated tool which uses a functional design of a planned integrated circuit (for example in the form of a gate level net list, or a Register Transfer Level (RTL) higher level representation of the design such as may be provided by a Verilog model) and a cell library providing a set of standard cells (the standard cells defining functional components, and being "building blocks" for putting together the layout of the integrated circuit according to the functional design) in order to generate a layout of an integrated circuit. If the integrated circuit is also to include one or more memory devices, then the place and route tool needs to place the memory instance representing each such memory device within the layout and then place the required standard cells around the memory instance(s) in order to form the layout of the integrated circuit according to the specified functional design.

However, such an approach can lead to inefficiencies in the usage of space resulting in the layout including one or more areas that do not contribute useful functionality. This may for example be due to there being wasted space at a boundary of a memory instance that is of insufficient size to accommodate standard cells, or due to the need to provide separation structures at the interface between the memory and the standard cells, such as may be required in the polysilicon layer of the integrated circuit layout.

This inefficient space usage contributes to the overall area required for the integrated circuit, and generally the larger the area of the integrated circuit, the larger the cost involved in the manufacture of the integrated circuit.

The cost implications of this inefficient space usage become more significant as more memory instances are included in integrated circuits, as the individual memory instances are made smaller (where the wasted space becomes a larger proportion of the overall area associated with the memory instance) and/or as process geometries shrink in modern data processing systems (since typically the separation structures required between the memory instance and the standard cells in the polysilicon layer become relatively larger as the process geometries shrink).

Accordingly, it would be desirable to provide an improved technique for generating the layout of an integrated circuit in situations where the layout will incorporate both standard cells and at least one memory instance generated by a memory compiler.

SUMMARY OF THE INVENTION

Viewed from a first aspect, the present invention provides a method of generating a layout of an integrated circuit, the layout incorporating standard cells defining functional components of the integrated circuit and at least one memory instance generated by a memory compiler to define a memory device of the integrated circuit, the method comprising: providing the memory compiler with a memory architecture specifying a definition of circuit elements and data defining rules for combining those circuit elements in order to generate memory instances conforming to the memory architecture; receiving input data specifying one or more properties of a desired memory instance; employing the memory compiler to generate the desired memory instance based on said input data such that the desired memory instance conforms to said memory architecture; providing a standard cell library, each standard cell within the standard cell library defining a corresponding functional component; in an integration enhancement mode of operation of the memory compiler, causing the memory compiler to reference at least one property of the standard cell library in order to generate the desired memory instance in a form that will reduce an area overhead associated with a boundary between that desired memory instance and surrounding standard cells when that desired memory instance is integrated into the layout; and generating the layout by populating standard cell rows extending in a first direction with standard cells selected from said standard cell library in order to provide the functional components required by the integrated circuit, and integrating into the layout the desired memory instance provided by the memory compiler.

In accordance with the present invention, the memory compiler is provided with an integration enhancement mode of operation where the memory compiler references at least one property of the standard cell library prior to generating the desired memory instance. By taking that at least one property of the standard cell library into account, the memory compiler is then able to generate the desired memory instance in a form that will reduce an area overhead associated with a boundary between that desired memory instance and the surrounding standard cells when that desired memory instance is integrated into the layout.

There are a number of properties of the standard cell library that can be referred to by the memory compiler. For example, in one embodiment, the design of the standard cells of the standard cell library may be such that they do not allow free space between the standard cells and an edge of the memory instance but instead require the standard cells to abut directly against an edge of the memory instance. In that scenario, the memory compiler can take that property into account in order to generate the desired memory instance in a form that will reduce the width of a polysilicon interface region required within the polysilicon layer to separate the desired memory instance from adjacent standard cells. Considering another example, the at least one property of the standard cell library referenced by the memory compiler may be the height specified for the standard cell rows, and by taking that property into account the memory compiler can be arranged to generate a desired memory instance in a form such that the width of the desired memory instance is constrained to be a integer multiple of the row height, thereby removing any wasted space that might otherwise be present.

Whilst the above-mentioned property of the standard cell library may be provided as an input to the memory compiler during operation of the compiler, in an alternative embodiment this property may be understood and designed into the memory compiler and standard cell library, hence avoiding the need for any such input to the memory compiler during operation.

The integration enhancement mode of operation may be the only mode of operation of the memory compiler, or may be one of a number of modes of operation available to the memory compiler.

In one embodiment, the method further comprises providing the memory compiler with at least one further mode of operation in which the memory compiler does not reference said at least one property of the standard cell library when generating the desired memory instance, resulting in an increase in said area overhead associated with said boundary when that desired memory instance is integrated into the layout, when compared with the area overhead associated with said boundary when the memory compiler is operated in said integration enhancement mode of operation. By provision of the at least one further mode of operation, backwards compatibility can be ensured, thereby allowing the memory compiler to be used, for example, in situations where the properties of the standard cell library are such that they do not allow the memory compiler to employ the integration enhancement mode of operation.

In one embodiment, the layout includes a polysilicon layer comprising a plurality of polysilicon tracks extending in a second direction through the polysilicon layer, the second direction being orthogonal to said first direction that the standard cell rows extend in. The polysilicon layer includes at least one polysilicon interface region separating the desired memory instance from adjacent standard cells, each said at least one polysilicon interface region providing a separation distance extending in said first direction. Said at least one property of the standard cell library referenced by the memory compiler in said integration enhancement mode of operation may be a property indicating that the design of the standard cells of that standard cell library require the standard cells to abut directly against an edge of the desired memory instance extending in said second direction. If so, in said integration enhancement mode of operation of the memory compiler, the memory compiler generates the desired memory instance in a form that will reduce the separation distance of the polysilicon interface region when that desired memory instance is integrated into the layout.

The polysilicon interface region can take a variety of forms. However, in one embodiment each said at least one polysilicon interface region comprises dummy polysilicon tracks extending in said second direction, and in said integration enhancement mode of operation of the memory compiler, the memory compiler generates the desired memory instance in a form that will reduce the number of dummy polysilicon tracks in the polysilicon interface region. Accordingly, in such an embodiment, since it is known that the standard cell library has constrained the design of the standard cells such that the standard cells are required to abut directly against an edge of the desired memory instance extending in the second direction, the number of dummy polysilicon tracks that the memory compiler needs to generate in association with the desired memory instance can be reduced, giving an overall reduction in the separate distance of the polysilicon interface region.

In one particular embodiment, each said at least one polysilicon interface region comprises a first interface sub-region associated with the desired memory instance and a second interface sub-region associated with standard cells. The property indicating that the design of the standard cells of that standard cell library require the standard cells to abut directly against an edge of the desired memory instance extending in said second direction is a property identifying a reduction in the number of dummy polysilicon tracks provided in the second interface sub-region. In the integration enhancement mode of operation of the memory compiler, the memory compiler generates the desired memory instance in a form having less dummy polysilicon tracks in the first interface sub-region than would be provided if the memory compiler were operated in at least one further mode of operation in which the memory compiler did not reference said at least one property of the standard cell library when generating the desired memory instance. Hence, in such an arrangement, by placing a constraint on the standard cell design, and then taking that constraint into account when using the memory compiler to generate memory instances, a reduction in the number of dummy polysilicon tracks in both the first interface sub-region and the second interface sub-region can be achieved, thereby giving significant area savings in the layout of the integrated circuit.

The dummy polysilicon tracks can take a variety of forms. In one embodiment, in said at least one further mode of operation the first interface sub-region would include as said dummy polysilicon tracks at least one supporting dummy track and at least one terminating dummy track having a thickness in said first direction greater than the thickness of each supporting dummy track. However, in said integration enhancement mode of operation of the memory compiler, the memory compiler generates the desired memory instance in a form where the first interface sub-region includes no terminating dummy track. The ability to remove the terminating dummy track gives rise to some significant space savings. In one particular embodiment, the second interface sub-region also includes no terminating dummy track, thus further improving the space savings.

In many layouts, the pitch spacing of the polysilicon tracks (also referred to as the "poly pitch") within the portion of the polysilicon layer associated with the desired memory instance is different to the poly pitch of the polysilicon tracks within sections of the polysilicon layer associated with standard cells. However, in one embodiment, the poly pitch in both sections is arranged to be the same, and in that embodiment when the memory compiler is operating in the integration enhancement mode of operation, it is able to generate a desired memory instance in a form that will additionally reduce the number of supporting dummy tracks in each polysilicon interface region. In one particular embodiment, such an approach may result in only a single supporting dummy track being required within each polysilicon interface region.

In embodiments where the memory instance is placed partway along the length of the standard cell rows, thereby splitting a number of standard cell rows into two portions, a first polysilicon interface region will be formed at a first side of the desired memory instance and a second polysilicon interface region will be formed at an opposing side of the desired memory instance, both the first side and the opposing side extending in the second direction. Accordingly, in such embodiments, the above mentioned space savings can be realised in association with both polysilicon interface regions.

In one particular embodiment, due to the way in which the polysilicon tracks run within the design of a memory instance compared with the direction in which they run within standard cell rows, the memory instance is turned through 90 degrees prior to placement within the layout, such that the first side of the desired memory instance forms the top of the memory instance and the opposing side forms the bottom of the memory instance. The rows of memory cells within the memory instance then run along the second direction, i.e. tangential to the standard cell rows, and in parallel with the polysilicon tracks.

In addition to, or as an alternative to, the memory compiler considering the earlier-mentioned property of the standard cell library, the memory compiler may take into account the row height specified by the standard cell library. In particular, in one embodiment, the standard cell rows have a row height extending in a second direction orthogonal to said first direction, the row height being defined by the standard cell library. The at least one property of the standard cell library referenced by the memory compiler in said integration enhancement mode of operation may be said row height, and then in said integration enhancement mode of operation of the memory compiler, the memory compiler generates the desired memory instance in a form where the width of the desired memory instance in said second direction is constrained to be an integer multiple of the row height.

There are a number of ways in which the memory compiler can constrain the desired memory instance such that its width in the second direction is an integer multiple of the row height. In one embodiment, the memory instance comprises at least one memory array and a plurality of logic circuits coupled to each memory array, and in the integration enhancement mode of operation the memory compiler constrains the width of each memory array in the second direction to be an integer multiple of the row height.

In one particular embodiment, the width of each memory array in the second direction is dictated by the number of memory cells provided within each row of the memory array, and in the integration enhancement mode of operation, the memory compiler constrains the number of memory cells provided within each row of each memory array such that the width of each memory array in said second direction is said integer multiple of the row height.

There are a number of ways of constraining the number of memory cells provided within each row. For example, in one embodiment the possible word sizes of data to be stored within the memory array can be constrained so that the overall number of memory cells provided within each row ensures that the width of the memory array in the second direction is an integer multiple of the row height. In particular, each row will be constrained to store a predetermined number of words, where each word comprises a plurality of bits, and where each bit is stored in a memory cell. By appropriate constraint of the word size, this will constrain the number of memory cells in each row such that that number can only increase in units which ensure that the width of the memory array is equal to an integer multiple of the row height. Similarly, the multiplexing options of the memory array can be constrained to ensure that the number of memory cells in each row can only grow in units which are constrained to be an integer multiple of a row height. For example, if the memory design has a MUX-4 configuration, then the length of each row can only increase by four memory cells at a time, if the memory device has a MUX-8 configuration, then the length of each row can only increase by eight memory cells at a time, etc. By constraining the muxing configurations and/or the possible word sizes, it is possible then to ensure that the rows can only increase in increments which conform to multiples of the row height.

Alternatively or in addition, the memory compiler may constrain the width of the plurality of logic circuits coupled to each memory array so that those logic circuits have a width in the second direction which is constrained to be an integer multiple of the row height.

In addition to the memory arrays and associated logic circuits coupled to those memory arrays, it is known for memory instances to include edge cells. In one embodiment, in the integration enhancement mode of operation, the memory compiler selects a width of the edge cells in said second direction such that the width of the desired memory instance in said second direction is constrained to be an integer multiple of the row height. This constraint on the edge cell width can be used instead of, or in addition to, the earlier-described measures for constraining the width of the memory instance to be an integer multiple of the row height.

Viewed from a second aspect, the present invention provides a storage medium storing a memory compiler computer program for controlling a computer to generate a desired memory instance from a memory architecture associated with the memory compiler computer program, the memory architecture specifying a definition of circuit elements and data defining rules for combining those circuit elements, the memory compiler computer program having an integration enhancement mode of operation in which, during performance of a method of generating a layout of an integrated circuit, where the layout incorporates standard cells defining functional components of the integrated circuit and at least one memory instance defining a memory device of the integrated circuit, the memory compiler computer program is configured to reference at least one property of a standard cell library defining said standard cells in order to generate the desired memory instance in a form that will reduce an area overhead associated with a boundary between that desired memory instance and surrounding standard cells when that desired memory instance is integrated into the layout. In one embodiment, the storage medium can take the form of a non-transitory storage medium.

BRIEF DESCRIPTION OF THE DRAWINGS

The present invention will be described further, by way of example only, with reference to embodiments thereof as illustrated in the accompanying drawings, in which:

FIG. 7 illustrates the polysilicon tracks required within a polysilicon interface section in accordance with one embodiment;

FIG. 8 illustrates a single supporting polysilicon track that may be required to separate a memory instance region from a standard cell region within the polysilicon layer, in accordance with one embodiment where the poly pitch is the same in both the memory instance region and the standard cell region;

DESCRIPTION OF EMBODIMENTS

Figure 1:
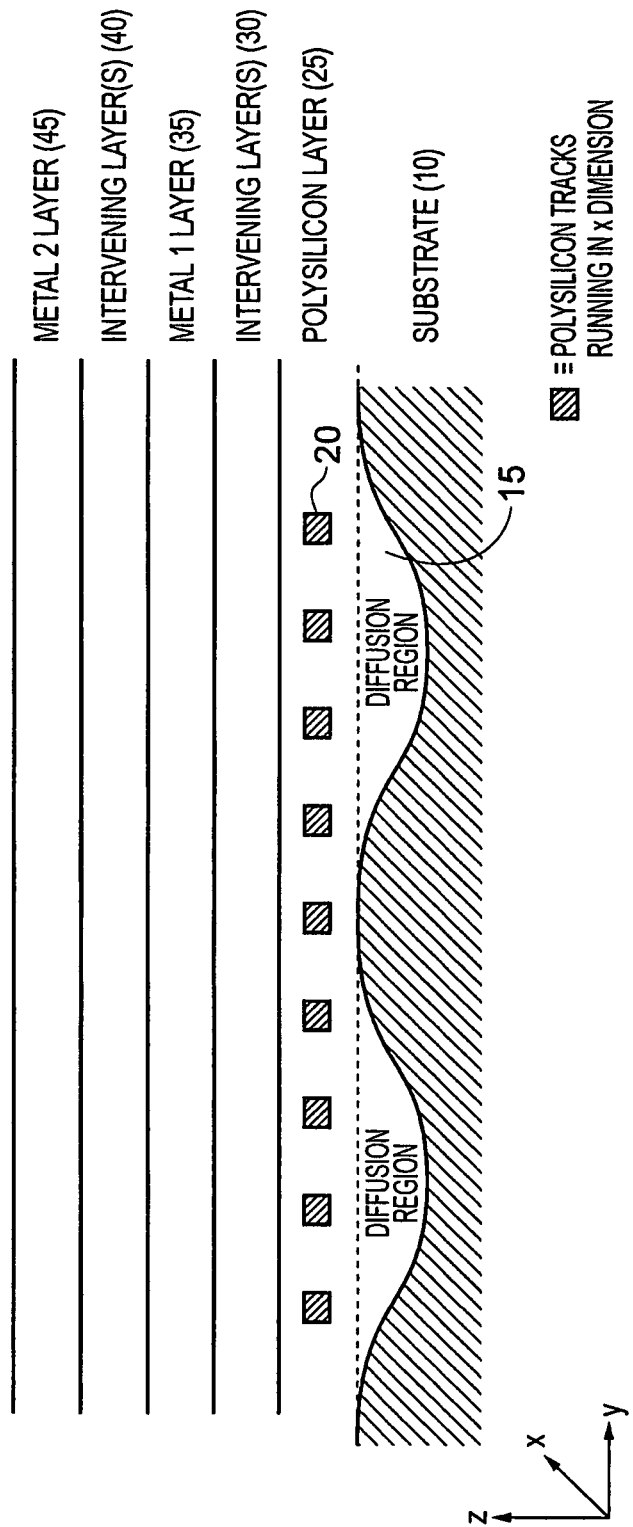
FIG. 1 is a diagram schematically illustrating the layers used to construct an integrated circuit.

An integrated circuit may be formed of a plurality of layers established upon a substrate such as a silicon substrate, as illustrated schematically in FIG. 1. In particular, one or more diffusion regions 15 are formed in or on the substrate 10, over which a polysilicon layer 25 is provided. Within the polysilicon layer, a plurality of polysilicon tracks 20 are formed. Using the labelled dimensions of FIG. 1, these tracks run in the X direction through the polysilicon layer 25.

Above the polysilicon layer a metal one (M0 layer 35 is provided, which may be separated in some embodiments from the polysilicon layer 25 by one or more intervening layers 30. In turn, the M1 layer 35 is separated from a metal two (M2) layer 45 by one or more further intervening layers 40 through which vias may be established as required. When generating a layout of an integrated circuit, the layout of each of these layers will be established. For the purposes of describing the following embodiments, particular consideration will be given to the polysilicon layer 25, and in particular a number of space saving measures will be discussed which can be used during the generation of the layout of the integrated circuit to reduce area inefficiencies that would otherwise occur at an interface between a memory instance and adjacent standard cells.

Figure 2A:
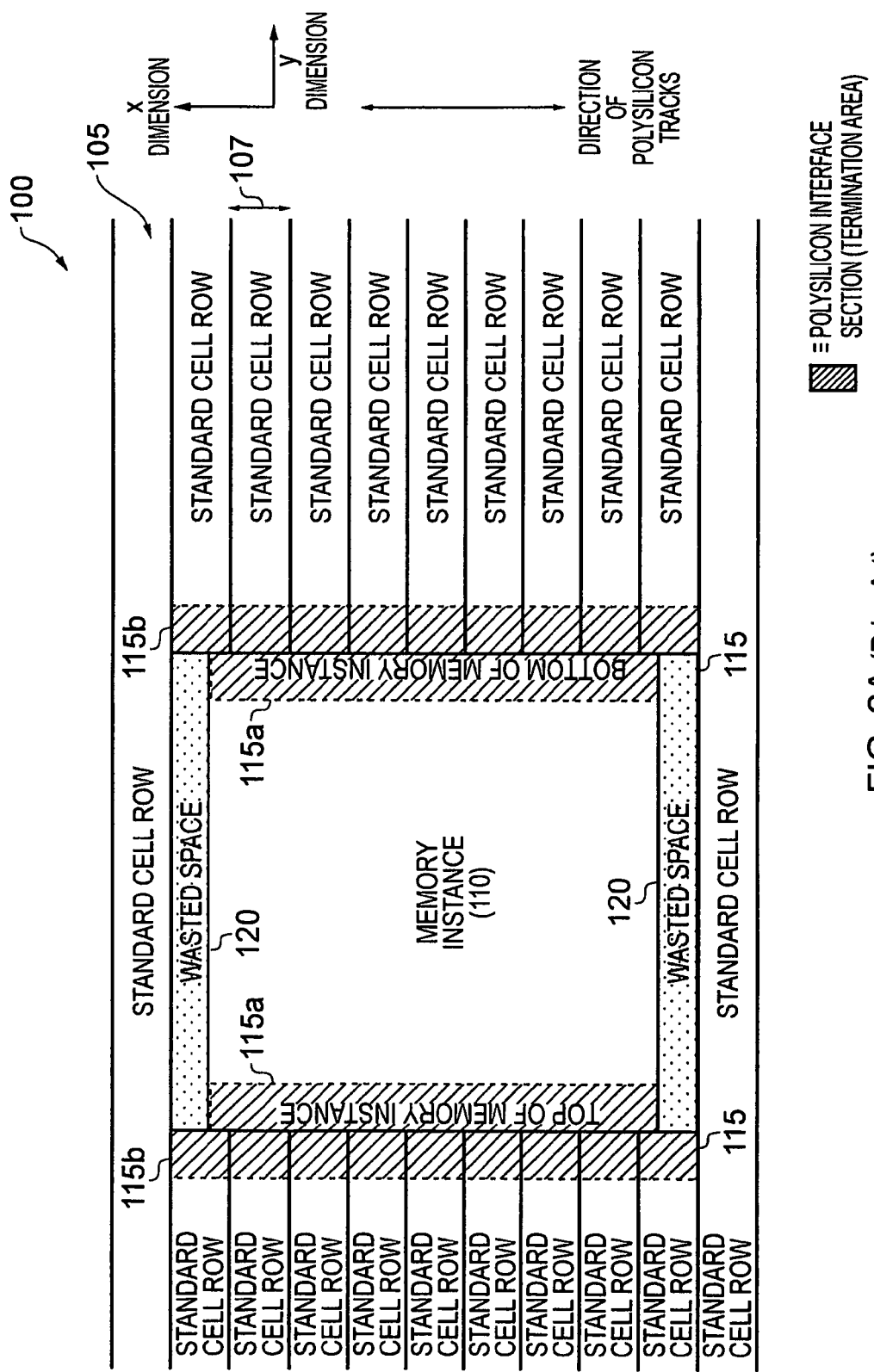
FIG. 2A schematically illustrates the area that a memory instance may occupy within the polysilicon layer of an integrated circuit layout in accordance with a prior art technique for generating the layout.
Figure 2B:
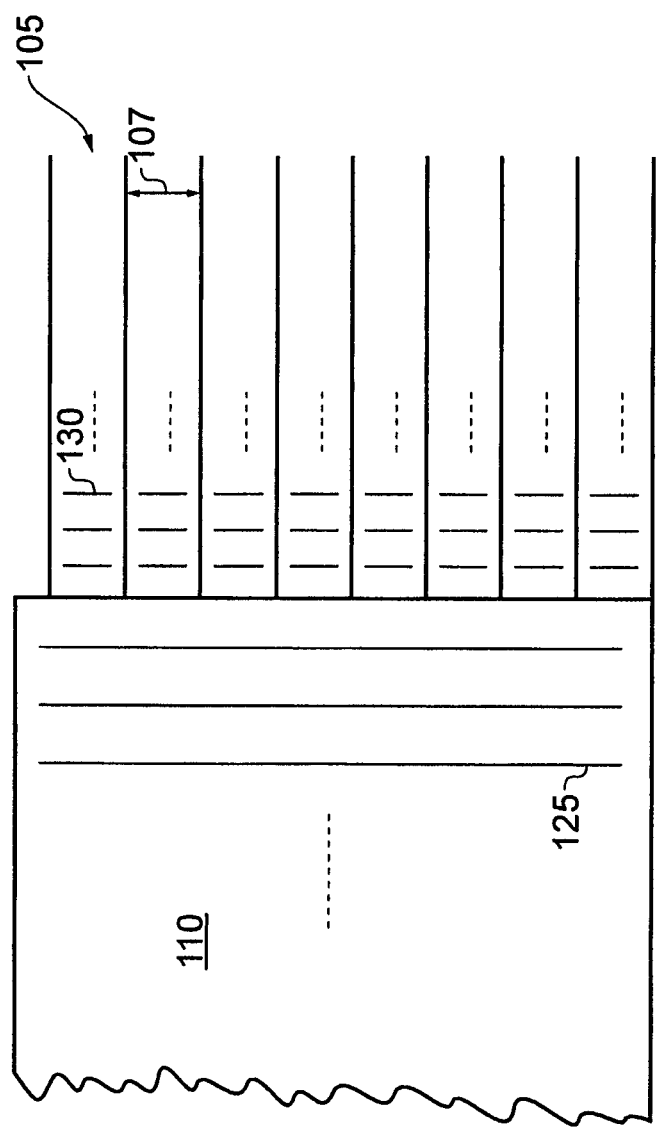
FIG. 2B schematically illustrates how polysilicon tracks are formed within the polysilicon layer of FIG. 2A.

Such area inefficiencies are illustrated schematically in FIG. 2A. As shown in FIG. 2A, a number of standard cell rows 105 are provided extending in the Y dimension of the polysilicon layer. Within the polysilicon layer 100, a plurality of polysilicon tracks are provided extending in the X dimension. FIG. 2B schematically illustrates these tracks. Within the area associated with the memory instance 110, polysilicon tracks 125 extend across substantially the entire width of the memory instance in the X dimension, there typically being a small gap at the extremities so that the polysilicon tracks do not extend the full width. However, depending on the process node used, those polysilicon tracks at the interface may extend the entire width. Also, in some cases, the polysilicon tracks are drawn full width in the layout and an extra layer is added to indicate where they should be cut. Similarly, within each standard cell row, a plurality of polysilicon tracks 130 are provided, these polysilicon tracks also being illustrated schematically in FIG. 2B. Typically the polysilicon tracks 130 extend in the X dimension for substantially the distance of the row height 107, but leaving a small gap at each end so that the polysilicon tracks in one standard cell row do not abut the polysilicon tracks in an adjacent standard cell row. However, at the interface, the polysilicon tracks will typically extend across the full width of each standard cell row in order to form one or more continuous polysilicon tracks in the X dimension. In some embodiments, the polysilicon tracks may be drawn full width in the layout and a special cut layer used to cut the polysilicon tracks at the top and bottom of the cells (other than at the interface with the memory instance).

Figure 3:
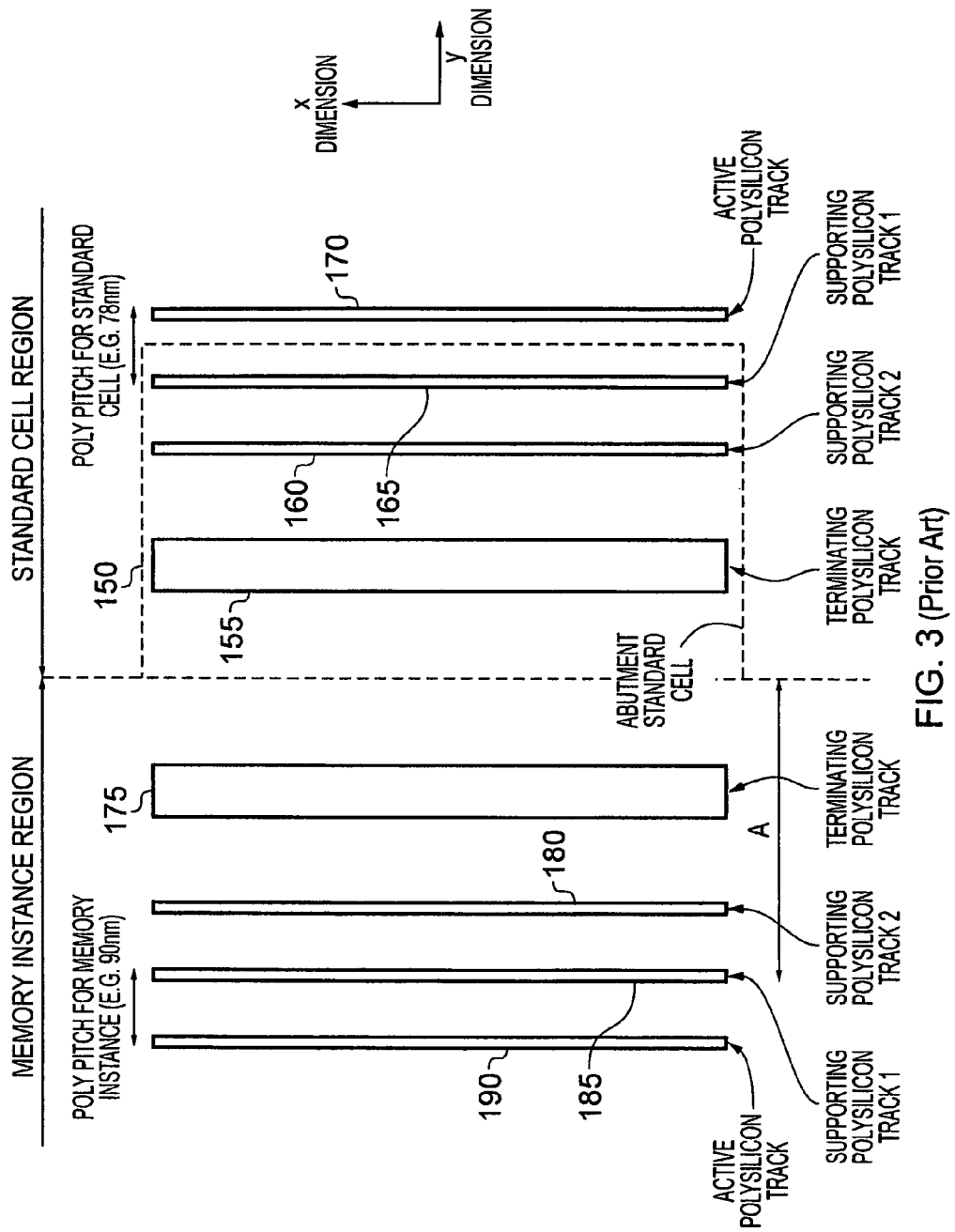
FIG. 3 illustrates the terminating and supporting polysilicon tracks that are required within the polysilicon interface sections shown in FIG. 2A in accordance with a known prior art technique.

As will be discussed in more detail with reference to FIG. 3, the actual positioning of the polysilicon tracks, and the form of those polysilicon tracks at the interface between the memory instance region and the standard cell region, may vary. However, as shown schematically by the areas 115 illustrated in FIG. 2A, a polysilicon interface section, also referred to as a termination area, is required between the memory instance 110 and the standard cell region in which standard cells embodying useful functional components can be instantiated. The polysilicon interface section 115 comprises a first sub-region 115a associated with a memory instance and second sub-region 115b associated with the standard cells. The first sub-region 115a typically includes a number of terminating polysilicon tracks and supporting polysilicon tracks as shown for example in FIG. 3. In the example of FIG. 3, a single terminating polysilicon track 175, and two supporting polysilicon tracks 180, 185, are provided within the first sub-region 115a associated with the memory instance. The first active polysilicon track 190 is then separated from the supporting polysilicon track 185 by a poly pitch distance appropriate for the memory instance (in one particular embodiment this poly pitch being 90 nm). In FIG. 3, only the portion of these various tracks 175, 180, 185, 190 corresponding in length to a standard cell row height are shown.

Within the sub-region 115b associated with the standard cells, an abutment standard cell 150 can be used to provide the required terminating polysilicon tracks and supporting polysilicon tracks appropriate for that sub-region. In the example shown in FIG. 3, a single terminating polysilicon track 155 is provided, along with two supporting polysilicon tracks 160, 165. A standard cell defining a first useful functional component for the standard cell row can then be placed against the abutment standard cell 150, and will include the first active polysilicon track 170, which is separate from the supporting polysilicon track 165 by a poly pitch distance applicable to the standard cell design being used (in the example of FIG. 3 this poly pitch is 78 nm).

In accordance with the prior art approach shown in FIG. 3, there is no constraint that a standard cell must be placed directly against the memory cell instance, and indeed for at least some of the standard cell rows there may be a gap between the edge of the memory instance and the first standard cell placed within that standard cell row (typically that first standard cell being the abutment standard cell).

The various terminating polysilicon tracks and supporting polysilicon tracks shown schematically in FIG. 3 result in the polysilicon interface section 115 having a significant width in the Y dimension. As shown in FIG. 2A, such a polysilicon interface section is typically required at both sides of the memory instance, assuming standard cells are going to be placed on both sides, and will be needed for every memory instance instantiated within the integrated circuit design. Accordingly, the presence of the polysilicon interface sections can give rise to a significant area requirement within the integrated circuit.

Further, the width of the memory instance in the X dimension will be dependent on the memory architecture used by the memory compiler to generate that memory instance, and the input data provided to the memory compiler specifying the desired properties of that memory instance. In accordance with prior art techniques, the width of the memory instance in the X dimension will have no correlation with the standard cell row height 107, and accordingly this can give rise to the wasted space 120 shown in FIG. 2A (typically this wasted space being present at both sides of the memory instance). In particular, this wasted space has a width in the X dimension that is insufficient to accommodate standard cells, and accordingly remains unused. The size of this wasted space will vary dependent on implementation, but will be present in association with every memory instance provided within the integrated circuit layout. Purely for the purposes of providing a concrete example, considering a particular process node, the standard cell row height for the 9-track library is 576 nm. The bit cell design for the memory instance provided by the foundry is typically not aligned to the library height and as a result the memory instance width has no relationship to the standard cell row height. In the worst case scenario, if the memory instance width is 576×n+1 nm, this results in wasted space of 575 nm at the memory instance boundary, where no standard cells can be placed.

Figure 4:
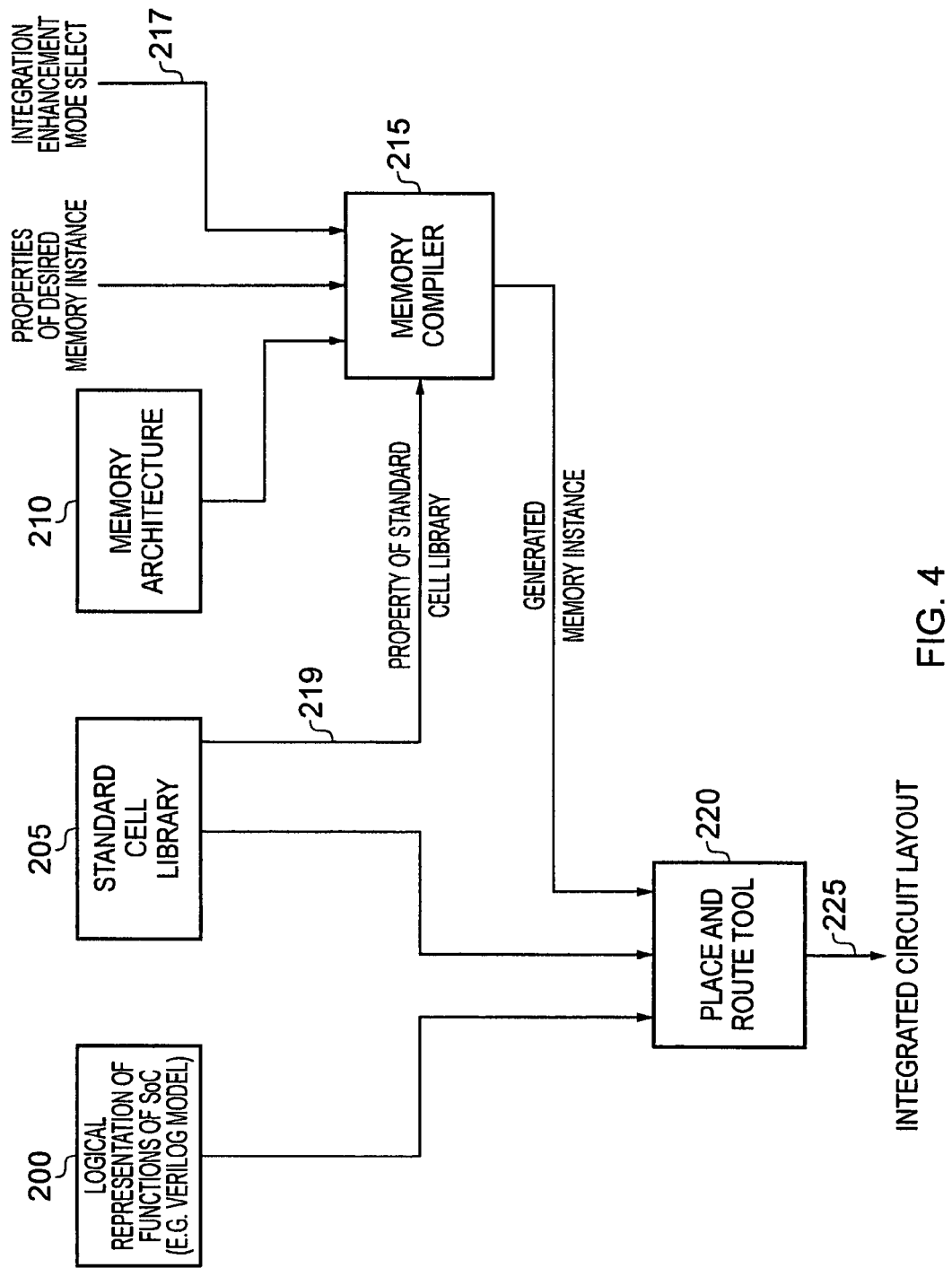
FIG. 4 is a block diagram schematically illustrating a layout generation system of one embodiment for generating a layout of an integrated circuit.

FIG. 4 is a block diagram schematically illustrating a system of one embodiment which is arranged to generate a layout of an integrated circuit in which the area overhead associated with a boundary between a memory instance and surrounding standard cells is reduced in relation to that described above with reference to FIG. 2A. As shown in FIG. 4, a memory compiler 215 is provided with a memory architecture 210 specifying a definition of circuit elements and data defining rules for combining the circuit elements in order to generate memory instances conforming to the memory architecture. Properties of the desired memory instance are then entered into the memory compiler 215, typically this being done via a graphical user interface (GUI) of the memory compiler. As will be appreciated by those skilled in the art, the properties of the desired memory instance may be specified by a variety of input parameters, those input parameters for example defining the size of the memory array, the multiplexing arrangements of the memory array, selection of various optional features such as power gating features, built-in-self-test (BIST) modes to be supported, etc.

The memory compiler 215 then generates the required memory instance based on the input parameters and the memory architecture 210. In accordance with the described embodiment, an integration enhancement mode may be selected via path 217, which causes the memory compiler to have reference to a property of the standard cell library when generating the memory instance. The path 219 schematically illustrates the provision of that standard cell library property to the memory compiler having regard to the selected standard cell library 205 to be used by a place and route tool 220 during generation of the integrated circuit layout. Whilst this property of the standard cell library may be provided dynamically to the memory compiler during operation of the system of FIG. 4, in one embodiment the provision of that property is provided to the memory compiler statically when the memory compiler is designed, and hence there will not actively be a link between the standard cell library 205 and the memory compiler 215 during operation.

Further, whilst in FIG. 4 it is assumed that the integration enhancement mode may be selected by a path 217, in an alternative embodiment the memory compiler may be configured to always operate in the integration enhancement mode of operation, hence obviating the need for a mode selection signal over path 217.

The place and route tool 220 is provided with a logical representation 200 specifying the functional design of the planned integrated circuit. In one embodiment, this may take the form of a gate level net list, whilst in an alternative embodiment this may take the form of a Register Transfer Level (RTL) higher level representation of the design, such as may be provided by a Verilog model. In addition, the place and route tool 220 is provided with a standard cell library 205 providing a set of standard cells, the standard cells defining functional components, and being building blocks for putting together the layout of the integrated circuit according to the functional design. In addition, the place and route tool 220 will receive any memory instances generated by the memory compiler 215 for incorporation within the layout.

The place and route tool 220 then generates the layout of the integrated circuit by populating standard cell rows with standard cells selected from the standard cell library 205 in order to provide the functional components required by the integrated circuit as specified by the logical representation 200, and further integrates into the layout the desired memory instance(s) provided by the memory compiler 215. As will be discussed in more detail later with reference to the remaining figures, when the memory compiler is operating in the integration enhancement mode of operation, the generated memory instances will have a form that will reduce the area overhead associated with a boundary between each memory instance and the surrounding standard cells when those memory instances are integrated into the layout by the place and route tool 220. In particular, referring back to the earlier FIG. 2A, each desired memory instance may have a form which reduces the width of the polysilicon interface section in the Y dimension, thereby reducing the area overhead. In addition, or alternatively, the generated memory instance may have a width in the X dimension which removes the wasted space 120 by ensuring that the width of the memory instance in the X dimension snaps to a common multiple of the standard cell library height 107.

Figure 5:
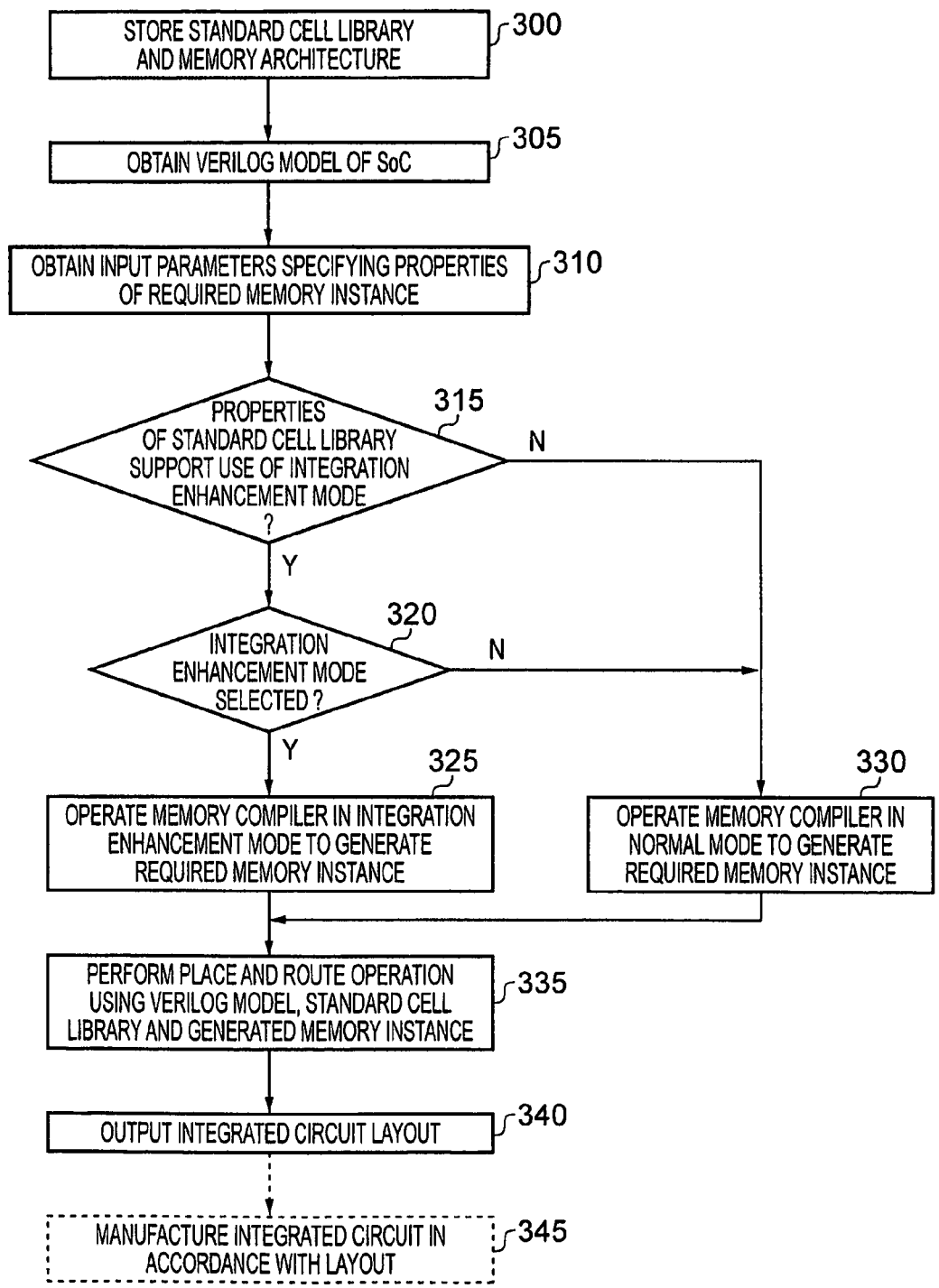
FIG. 5 is a flow diagram illustrating the operation of the layout generation system of FIG. 4 in accordance with one embodiment.

FIG. 5 is a flow diagram schematically illustrating the operation of the system of FIG. 4 in accordance with one embodiment. At step 300, the standard cell library 205 and memory architecture 210 are stored for access by the place and route tool 220 and memory compiler 215, respectively. At step 305, the Verilog model of the SoC 200 is then obtained, for example by reading that model from a storage device. Further, the input parameters specifying properties of each required memory instance are obtained at step 310, for example by entry of those input parameters through the GUI of the memory compiler 215.

At step 315, it is determined whether the properties of the standard cell library support use of the integration enhancement mode. For example, the memory compiler may be designed so that it can support the integration enhancement mode if one of a number of known standard cell libraries are used. If the standard cell library 205 is one of those particular standard cell libraries, then the integration enhancement mode is supported, whereas otherwise it is not. If the integration enhancement mode is not supported, then the process proceeds to step 330, where the memory compiler operates in a normal mode of operation to generate each required memory instance for forwarding to the place and route tool 220, during this normal mode of operation no properties of the standard cell library being taken into account by the memory compiler when generating the memory instance, and accordingly no area overhead reduction measures being taken by the memory compiler when generating the memory instance.

However, if the properties of the standard cell library do support use of the integration enhancement mode, then at step 320 it is determined whether the integration enhancement mode has been selected. If not, the process proceeds to step 330, whereas otherwise the process proceeds to step 325 where the memory compiler operates to generate each required memory instance taking into account one or more properties of the standard cell library, in order to reduce the area overhead associated with the boundary between each desired memory instance and the surrounding standard cells when that desired memory instance is integrated into the layout.

At step 335, the place and route tool 220 then performs a place and route operation using the Verilog model 200, the standard cell library 205, and any generated memory instances from the memory compiler 215, in order to output at step 340 an integrated circuit layout. Outputting of this generated integrated circuit layout can take a variety of forms, but it will typically be recorded as layout data on a computer readable medium.

Optionally, and not shown in FIG. 5, the layout data output at step 340 can be subjected to standard verification tests, to ensure that the place and route process has not introduced any unexpected anomalies. As shown by the dotted box 345, the process can then continue with the manufacture of the integrated circuit in accordance with the layout output at step 340.

Figure 6A:
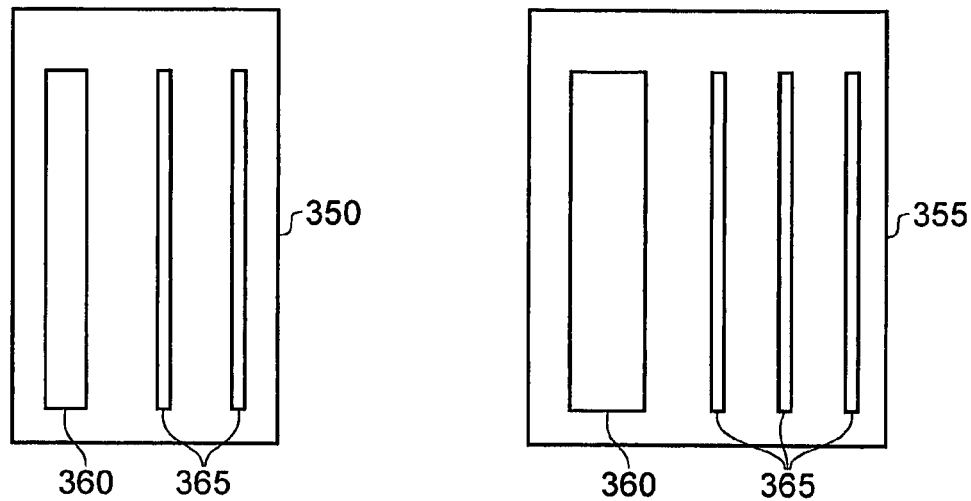
FIG. 6A illustrates abutment standard cells of a prior art technique and FIG. 6B illustrates corresponding abutment standard cells used in one embodiment.

As discussed earlier with reference to FIG. 3, the polysilicon interface section providing a boundary between a memory instance and adjacent standard cells includes a number of dummy polysilicon tracks including both supporting polysilicon tracks and terminating polysilicon tracks. Abutment standard cells such as those shown in FIG. 6A are used in known prior art techniques to form part of the polysilicon interface section 115, and to effectively separate the first active standard cell from the memory instance. As shown in FIG. 6A, the abutment cell 350 includes a terminating polysilicon track 360 and two supporting polysilicon tracks, and hence takes the form illustrated earlier with reference to FIG. 3. However, in alternative embodiments the abutment standard cell can take different forms. In particular, whilst the abutment cell will typically include one terminating polysilicon track that is relatively thick, the number of supporting polysilicon tracks can vary. Hence, by way of example, the abutment standard cell 355 contains one terminating polysilicon track 360 and three supporting polysilicon tracks 365.

As also discussed earlier with reference to FIG. 3, the memory instance typically produced by a memory compiler will include at least one relatively thick terminating polysilicon track, plus a number of supporting polysilicon tracks to effectively separate the first active polysilicon track used by the memory instance from the boundary with the standard cell region. By providing terminating polysilicon tracks, and a number of supporting polysilicon tracks, both within the memory instance, and within abutment standard cells, this provides flexibility as to how the standard cells are placed in relation to the boundary with the memory interface. Whilst in the example of FIG. 3, an abutment standard cell is placed directly against the boundary, alternatively the place and route tool used to form the memory instance can provide actual gaps between the edge of the memory instance and the first standard cell in a row. In some instances, those gaps can be used instead of an abutment standard cell, as long as the above-mentioned terminating polysilicon tracks and supporting polysilicon tracks are provided both within the memory instance and within the standard cell regions, hence providing a large gap between the active polysilicon tracks in both the memory instance and the standard cell regions. This flexibility in how the region immediately adjacent the boundary of the memory instance is used is one of the reasons why design rule checking (DRC) rules typically require the memory compiler to generate memory instances having a terminating polysilicon track 175 at the edge of the memory instance. In particular, by providing this terminating polysilicon track at the boundary of the memory instance, it can be ensured that the memory device can be formed correctly and operate correctly irrespective of whether the adjacent standard cell region contains open spaces, or has standard cells very close to the memory boundary which do not have any limitations placed on them with regard to the polysilicon track spacing relative to the memory boundary.

Figure 6B:
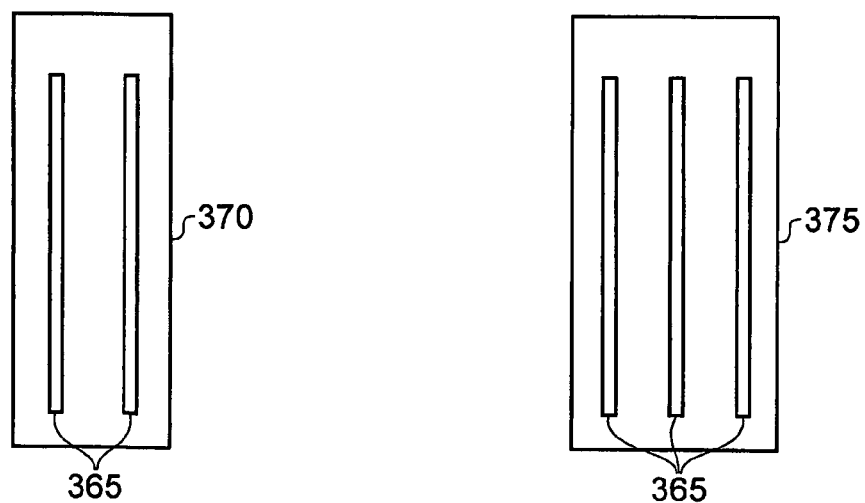

However, in accordance with one embodiment, the standard cell library may be designed such that the standard cells of that library are required to abut directly against an edge of the memory instance, without free space being permitted. A series of abutment standard cells can then be provided to be used as the cells to abut directly against the memory instance. Due to the use of such abutment cells, and the requirement that there are no open spaces allowed between the memory instance and the adjacent standard cell regions, there is no longer a need for the relatively thick terminating polysilicon track, and accordingly the standard cells 370, 375 shown in FIG. 6B illustrate replacement standard cells that can be used for the standard cells 350, 355 of FIG. 6A if such a constraint is placed on standard cell placement.

If the standard cell library provides such a constraint, then in one embodiment the memory compiler can be operated in an integration enhancement mode where the fact that the constraint is present within the standard cell library is used to reduce the thickness of the polysilicon interface sub-region associated with the memory instance. In particular, it is also possible in that scenario to avoid the need for a terminating polysilicon track 175 within that region of the interface. Accordingly, FIG. 7 illustrates the form of polysilicon interface section that can be used between a memory instance region and a standard cell region when the memory compiler is operated in the integration enhancement mode. As shown in FIG. 7, an abutment standard cell 400 is used containing two supporting polysilicon tracks 405, but no terminating polysilicon track. There is a requirement that an abutment standard cell is directly abutted against the interface of the memory in every standard cell row intersected by the memory instance.

Due to this requirement, the memory instance no longer needs a terminating polysilicon track, and accordingly in this embodiment two supporting polysilicon tracks 415 are all that is required to be provided within the sub-region of the polysilicon interface section associated with the memory instance. The first active polysilicon track 420 within the memory instance can then be placed next to the furthest supporting polysilicon track 415 from the memory boundary, with the separation of the active polysilicon track from the supporting polysilicon track being defined by the poly pitch appropriate for the memory instance. Similarly, within the standard cell region, the first active polysilicon track 410 can be placed adjacent to the supporting polysilicon track 405 furthest from the boundary, again at a poly pitch distance appropriate for the standard cell region. Hence the supporting polysilicon tracks 405, 415 provide a poly pitch transition region to ensure correct formation of the polysilicon tracks within both the memory instance region and the standard cell region.

By comparison of FIG. 7 with FIG. 3, it will be seen that a significant reduction in the overall width in the Y dimension of the polysilicon interface section is possible, since now the polysilicon interface section only requires two supporting polysilicon tracks in the memory sub-region and two supporting polysilicon tracking in the standard cell sub-region, avoiding the requirement for two terminating polysilicon tracks and the associated separation distances that would be required between those terminating polysilicon tracks and the memory boundary, and between those terminating polysilicon tracks and the first adjacent supporting polysilicon track.

Purely by way of example, in one embodiment of FIG. 3, the distance A between the memory instance boundary and the furthermost supporting polysilicon track 185 is 560 nm, 380 nm of that distance being taken up by the terminating polysilicon track and the associated spacing between that track and the boundary, and between that track and the supporting polysilicon track 180. In contrast, in FIG. 7, the equivalent distance B is reduced to 180 nm, by virtue of the memory compiler being able to take advantage of the constraint placed on the standard cell placement, in particular the requirement that standard cells have to abut directly against the edge of the memory instance. As will be apparent from the earlier example of FIG. 2A, in a typical situation this area penalty of the polysilicon interface section is present at both the top and bottom of the memory instance, and hence by adopting the configuration of FIG. 7 rather than the configuration of FIG. 3, the reduction in width in the pair of polysilicon interface sections is of the order of 760 nm.

In addition, this approach also reduces the area overhead requirement in the standard cells by eliminating the need for the terminating polysilicon track 155, and accordingly if the memories and standard cells are both designed in this manner, they can seamlessly fit together and provide reduced area for the SoC-level design.

Whilst the above area savings have been described in relation to an interface between a memory region and a standard cell region, the same space savings could also be achieved in situations where it is desired to abut two memory instances against each other.

In one embodiment, the memory compiler is also able to operate with standard cell libraries that do not provide the above mentioned constraint, and hence do not require the standard cells to abut directly against the edge of the memory instance. In that scenario, the memory compiler will not operate in the integration enhancement mode, and instead will create memory edge cells having the form illustrated schematically earlier with reference to FIG. 3, including both the terminating polysilicon track 175 and a number of supporting polysilicon tracks 180, 185, thus providing backwards compatibility of the memory compiler for use with standard cell libraries that do not support the use of the integration enhancement mode.

If the poly pitch in the memory instance region can be made the same as the poly pitch in the standard cell region, then further area reductions can be achieved in the integration enhancement mode of operation by further reducing the width of the polysilicon interface sections. In particular, as shown in FIG. 8, in such a scenario, the first active polysilicon track 410 in the standard cell region only needs to be separated from the first active track 420 in the memory instance region by a single supporting polysilicon track 425 provided at the boundary. No abutment standard cell is required in such a situation. Hence, in scenarios where the standard cell library requires standard cells to abut directly against an edge of the memory instance, and the poly pitch of the standard cells matches that of the poly pitch used within the memory instance, then the memory compiler can generate memory instances that further reduce the width of the polysilicon interface section when those memory instances are integrated within the layout of the integrated circuit.

Figure 9:
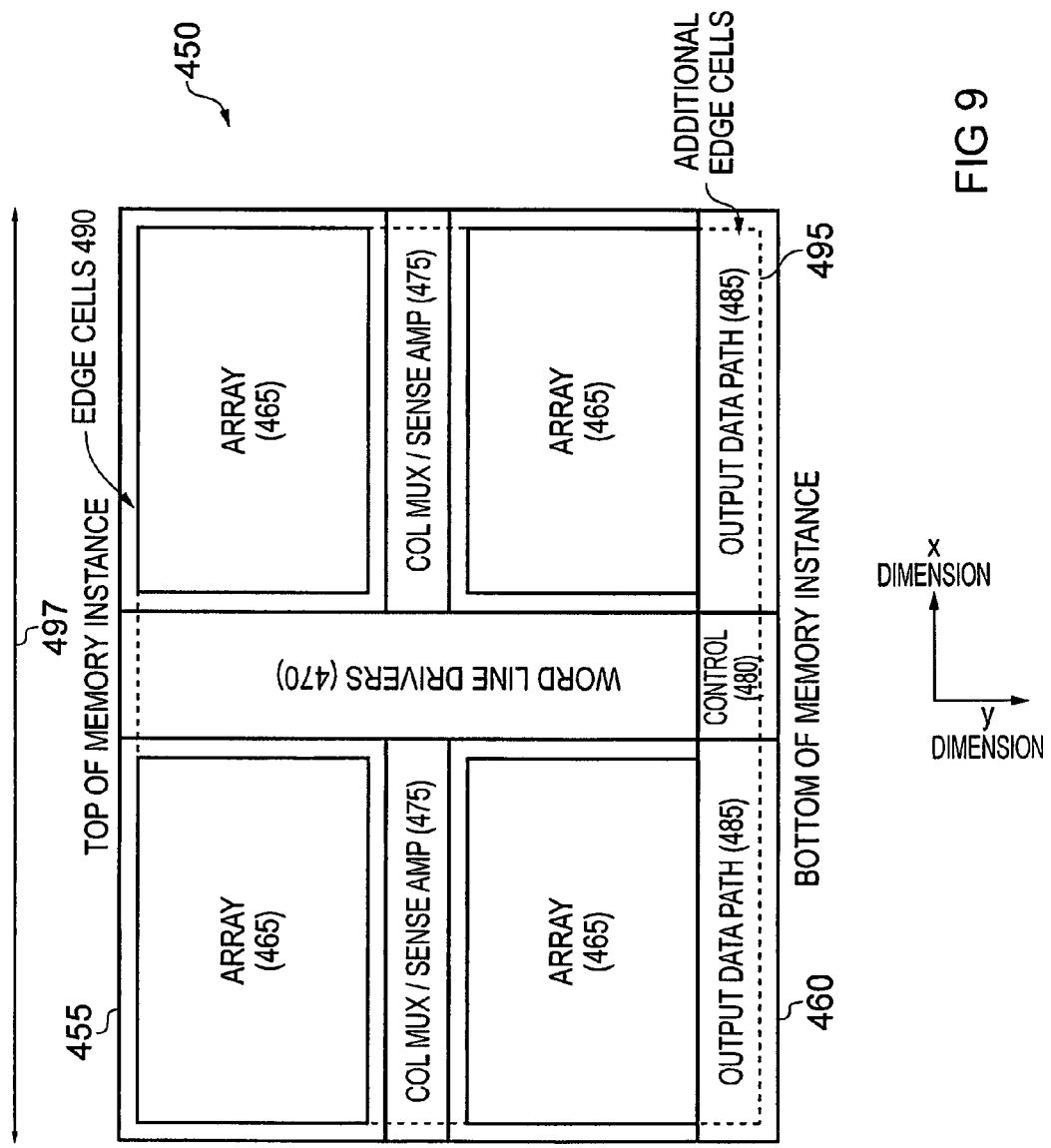
FIG. 9 schematically illustrates an arrangement of a memory instance generated by a memory compiler in accordance with one embodiment.

FIG. 9 illustrates an example configuration of a memory instance 450 that may be created by the memory compiler, rotated through 90° for placement within the integrated circuit layout of the form discussed earlier with reference to FIG. 2A. In this example, four memory arrays 465 are provided, each array comprising a matrix of memory cells arranged in rows and columns. Word line driver circuitry 470 is provided for enabling particular rows within each array to be addressed via word lines running through each array in the direction of the rows. As will be understood, bit lines will be associated with each of the columns of memory cells, and column multiplexer and sense amplifier circuitry 475 will be associated with each of those columns to allow data to be written into the addressed memory cells of a row by controlling the values on the relevant bit lines, or to allow the data values held in those addressed memory cells to be read during a read operation by evaluation of the voltage on the relevant bit lines, Further, control circuitry 480 is provided for controlling the operation of the various word line drivers 470, column multiplexers and sense amplifiers 475, etc. Output data paths 485 are also provided for outputting data read from the addressed memory cells of the arrays 465. Typically, edge cells 490 will be placed around the read edge of each array 465 to separate the array from the surrounding circuitry. In addition, similar edge cells 495 can be used to separate the components of the memory from the actual memory boundary.

Figure 10:
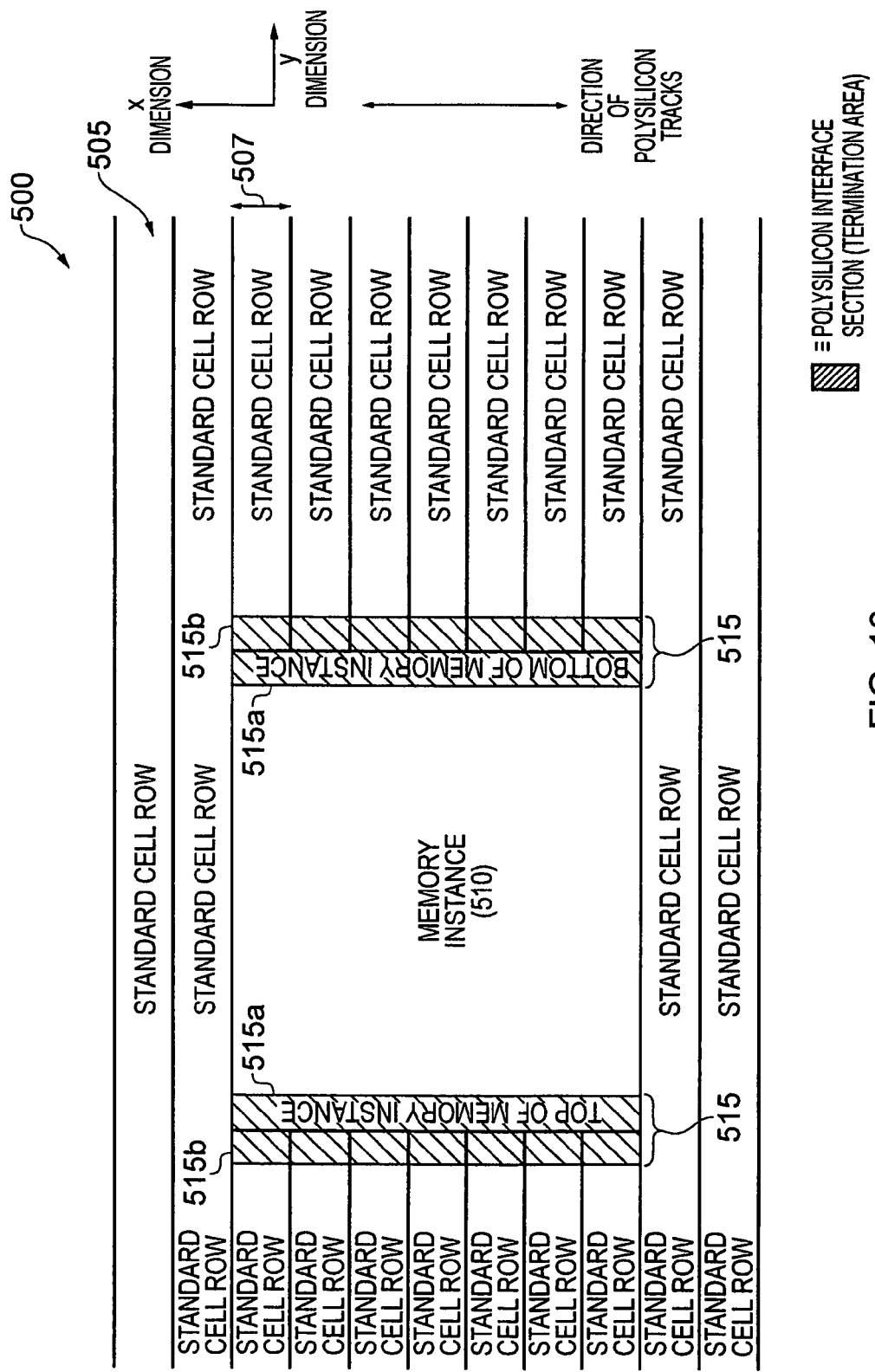
FIG. 10 schematically illustrates the area that a memory instance may occupy within the polysilicon layer of an integrated circuit layout when employing a method of generating a layout in accordance with one embodiment.

As can be seen from FIG. 9, the rows of the arrays run in the X dimension, and the columns run in the Y dimension, with the memory instance having been rotated by 90° before placement within the integrated circuit, so that the top of the memory instance 455 forms one boundary having an associated polysilicon interface section, and the bottom of the memory instance 460 forms another boundary having an associated polysilicon interface section. However, as shown in FIG. 10, due to the space saving measures available when using the integration enhancement mode of operation for the memory compiler discussed earlier, the width of the polysilicon interface sections 515 can be significantly reduced when compared with the width of the equivalent polysilicon interface sections 115 of the known prior art approach, due to reductions in the width of both the sub-regions 515a associated with the memory instance, and the sub-regions 515b associated with the standard cells.

Furthermore, in accordance with one embodiment the memory compiler can be arranged to additionally, or alternatively, constrain the memory instance so that its width in the X dimension is an integer multiple of the standard cell row height 507, hence avoiding the wasted space 120 shown in the earlier example of FIG. 2A.

At the SoC level, the placement of the standard cell rows is limited to the row height specified by the standard cell library.

For example, for a particular process node the standard cell row height for the nine-track cell library is 576 nm. Typically, the bit cell provided by the foundry for use in generating the memory arrays of a memory instance is not aligned to the standard cell row height, and as a result, the memory instance width 497 shown in FIG. 9 has no relationship to the standard cell row height. This can give rise to significant wasted space when the memory instance is incorporated within the layout of the SoC. As the number of memory instances on a typical SoC continue to increase, this wasted space has more and more of a marked effect on the overall area of the integrated circuit. In accordance with one embodiment, when in the integration enhancement mode of operation, the memory compiler takes the row height of the standard cells into account when designing the memory instance, so as to generate a memory instance whose width 497 is an integer multiple of the standard cell row height. This can be achieved in a number of ways. For example, in one embodiment, the individual bit cells used to make up the memory array can be designed so that when they are formed into rows of the memory array, those rows conform to a multiple of the standard cell row height. In addition, the individual cells used to form the word line driver circuits and/or the edge cells can be designed so as to conform to a multiple of the standard cell row height, such that the total memory instance width 497 snaps to the standard cell row height grid. For example, whilst the edge cells will typically have to have a minimum width in order to achieve the desired isolating properties, those edge cells can be made wider if desired in order to ensure that the overall width 497 of the memory instance is a multiple of the standard cell row height.

For a memory compiler that supports mux 4, mux 8 and mux 16 as multiplexer options, then as the word width is increased in one bit increments, the memory instance width increases (at a minimum) in multiple of four times the bit cell width. Therefore, if four times the bit cell width is constrained having regards to the standard cell row height, the memory compiler can be designed to generate instances whose overall memory cell width 497 is an integer multiple of the standard cell row height 507, hence avoiding any wasted space 120 when that memory instance is integrated into the layout of the integrated circuit. In addition to constraining the manner in which the row size of the arrays increases having regards to the multiplexing options, the amount by which the word width can be increased can also be constrained. For example, rather than allowing the word width to increase in one bit increments, the word width may be constrained to only increase in two bit increments or four bit increments.

Figure 11:
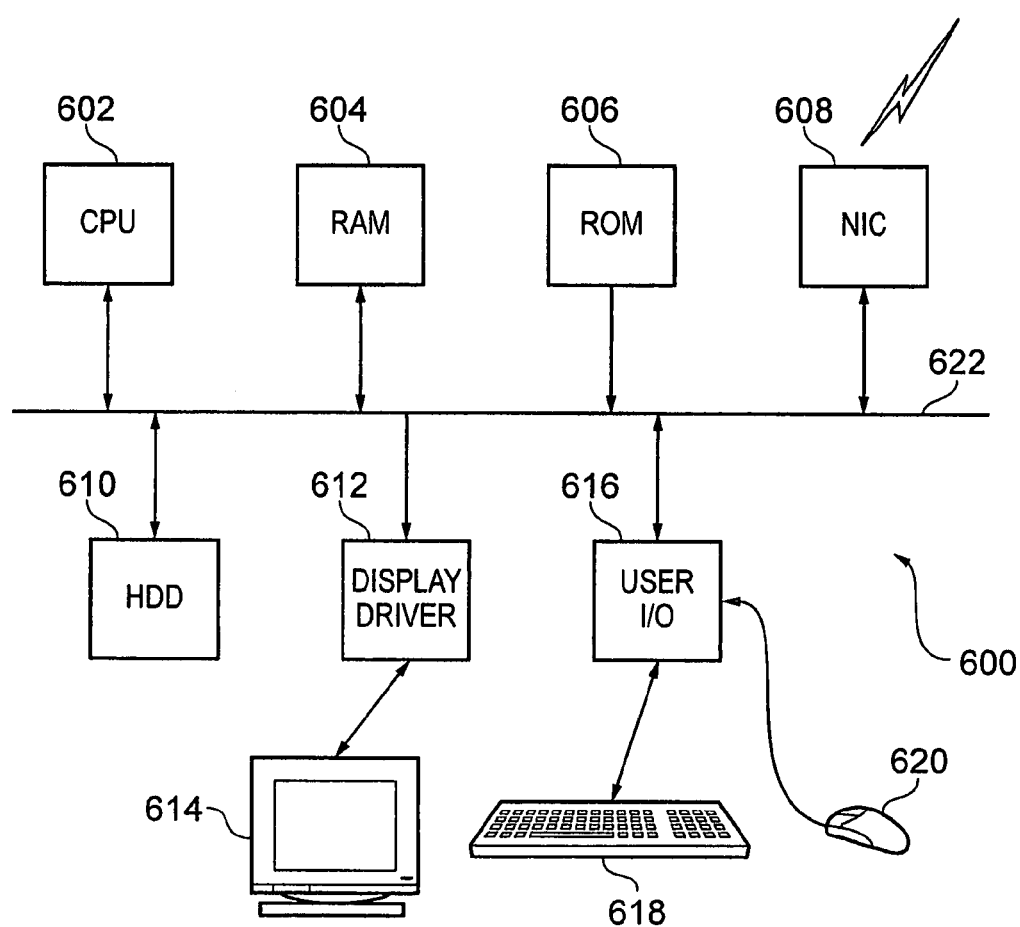
FIG. 11 is a diagram of a computer system on which suitable computer programs can be executed to generate a layout of an integrated circuit in accordance with the above described embodiments.

FIG. 11 schematically illustrates a general purpose computer 600 of the type that may be used to implement the above described memory compiler operations and place and route operations in order to generate a layout of an integrated circuit. The general purpose computer 600 includes a central processing unit 602, a random access memory 604, a read only memory 606, a network interface card 608, a hard disk drive 610, a display driver 612 and monitor 614 and a user input/output circuit 616 with a keyboard 618 and mouse 620 all connected via a common bus 622. In operation, the central processing unit 602 will execute computer program instructions that may be stored in one or more of the random access memory 604, the read only memory 606 and the hard disk 610 or dynamically downloaded via the network interface card 608. The results of the processing performed may be displayed to a user via the display driver 612 and the monitor 614. User inputs for controlling the operation of the general purpose computer 600 may be received via the user input/output circuit 616 from the keyboard 618 or the mouse 620 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 600. When operating under control of an appropriate computer program, the general purpose computer 600 can perform the above described memory compiler operations in order to generate desired memory instances, and indeed can perform the place and route operations used to produce the layout of the integrated circuit incorporating such desired memory instances, and hence can be considered to form an apparatus for performing the above described operations. The architecture of the general purpose computer 600 could vary considerably and FIG. 11 is only one example.

From the above described embodiments, it will be appreciated that such embodiments enable a significant reduction in the total area overhead caused by a boundary between a memory instance and adjacent standard cells when the memory instance is integrated into the layout of a SoC. In accordance with one embodiment, the poly interface at the top and bottom of the memory instance is changed to reduce unnecessary overhead when the memory instance and standard cells are integrated together at the SoC level, in particular in situations where the standard cell library constrains the standard cells so as to require standard cells to abut directly against an edge of the memory instance. Alternatively, or in addition, the width of the memory instance is constrained to snap to a common multiple of the standard cell library height. In one embodiment this can be achieved by requiring that the bit cells of a row snap to some multiple of the library row height, and that the overall width of the word line driver channel and memory edge cells snap to a multiple of the library row height.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A method of generating a layout of an integrated circuit, the layout incorporating standard cells defining functional components of the integrated circuit and at least one memory instance generated by a memory compiler to define a memory device of the integrated circuit, the method comprising:

providing the memory compiler with a memory architecture specifying a definition of circuit elements and data defining rules for combining those circuit elements in order to generate memory instances conforming to the memory architecture;

receiving input data specifying one or more properties of a desired memory instance;

employing the memory compiler to generate the desired memory instance based on said input data such that the desired memory instance conforms to said memory architecture;

providing a standard cell library, each standard cell within the standard cell library defining a corresponding functional component;

in an integration enhancement mode of operation of the memory compiler, causing the memory compiler to reference at least one property of the standard cell library in order to generate the desired memory instance in a form that will reduce an area overhead associated with a boundary between that desired memory instance and surrounding standard cells when that desired memory instance is integrated into the layout; and generating the layout by populating standard cell rows extending in a first direction with standard cells selected from said standard cell library in order to provide the functional components required by the integrated circuit, and integrating into the layout the desired memory instance provided by the memory compiler.

2. A method as claimed in claim 1, further comprising:
providing the memory compiler with at least one further mode of operation in which the memory compiler does not reference said at least one property of the standard cell library when generating the desired memory instance, resulting in an increase in said area overhead associated with said boundary when that desired memory instance is integrated into the layout, when compared with the area overhead associated with said boundary when the memory compiler is operated in said integration enhancement mode of operation.

3. A method as claimed in claim 1, wherein:
the layout includes a polysilicon layer comprising a plurality of polysilicon tracks extending in a second direction through the polysilicon layer, the second direction being orthogonal to said first direction;
the polysilicon layer includes at least one polysilicon interface region separating the desired memory instance from adjacent standard cells, each said at least one polysilicon interface region providing a separation distance extending in said first direction;
said at least one property of the standard cell library referenced by the memory compiler in said integration enhancement mode of operation is a property indicating that the design of the standard cells of that standard cell library require the standard cells to abut directly against an edge of the desired memory instance extending in said second direction; and
in said integration enhancement mode of operation of the memory compiler, the memory compiler generates the desired memory instance in a form that will reduce the separation distance of the polysilicon interface region when that desired memory instance is integrated into the layout.

4. A method as claimed in claim 3, wherein:
each said at least one polysilicon interface region comprises dummy polysilicon tracks extending in said second direction; and
in said integration enhancement mode of operation of the memory compiler, the memory compiler generates the desired memory instance in a form that will reduce the number of dummy polysilicon tracks in the polysilicon interface region.

5. A method as claimed in claim 4, wherein:
each said at least one polysilicon interface region comprises a first interface sub-region associated with the desired memory instance and a second interface sub-region associated with standard cells;
said property indicating that the design of the standard cells of that standard cell library require the standard cells to abut directly against an edge of the desired memory instance extending in said second direction is a property identifying a reduction in the number of dummy polysilicon tracks provided in the second interface sub-region; and in said integration enhancement mode of operation of the memory compiler, the memory compiler generates the desired memory instance in a form having less dummy polysilicon tracks in the first interface sub-region than would be provided if the memory compiler were operated in at least one further mode of operation in which the memory compiler did not reference said at least one property of the standard cell library when generating the desired memory instance.

6. A method as claimed in claim 5, wherein:
in said at least one further mode of operation the first interface sub-region would include as said dummy polysilicon tracks at least one supporting dummy track and at least one terminating dummy track having a thickness in said first direction greater than the thickness of each supporting dummy track; and
in said integration enhancement mode of operation of the memory compiler, the memory compiler generates the desired memory instance in a form where the first interface sub-region includes no terminating dummy track.

7. A method as claimed in claim 6, wherein the second interface sub-region also includes no terminating dummy track.

8. A method as claimed in claim 6, wherein:
a pitch spacing in the first direction of the polysilicon tracks within a section of the polysilicon layer associated with the desired memory instance is the same as the pitch spacing in the first direction of the polysilicon tracks within a further section of the polysilicon layer associated with the standard cells; and
in said integration enhancement mode of operation of the memory compiler, the memory compiler generates the desired memory instance in a form that will additionally reduce the number of supporting dummy tracks in each said at least one polysilicon interface region.

9. A method as claimed in claim 8, wherein in said integration enhancement mode of operation of the memory compiler, the memory compiler generates the desired memory instance in a form that results in a single supporting dummy track within each said at least one polysilicon interface region.

10. A method as claimed in claim 3, wherein said at least one polysilicon interface region comprises a first polysilicon interface region at a first side of the desired memory instance and a second polysilicon interface region at an opposing side of the desired memory instance, both the first side and the opposing side extending in said second direction.

11. A method as claimed in claim 1, wherein:
said standard cell rows have a row height extending in a second direction orthogonal to said first direction, the row height being defined by the standard cell library;
said at least one property of the standard cell library referenced by the memory compiler in said integration enhancement mode of operation is said row height; and
in said integration enhancement mode of operation of the memory compiler, the memory compiler generating the desired memory instance in a form where the width of the desired memory instance in said second direction is constrained to be an integer multiple of the row height.

12. A method as claimed in claim 11, wherein:
the memory instance comprises at least one memory array and a plurality of logic circuits coupled to said at least one memory array;
in said integration enhancement mode of operation of the memory compiler, the memory compiler constrains the width of said at least one memory array in said second direction to be an integer multiple of the row height.

13. A method as claimed in claim 12, wherein:
the width of each said at least one memory array in said second direction is dictated by the number of memory cells provided within each row of the memory array; and
in said integration enhancement mode of operation of the memory compiler, the memory compiler constrains the number of memory cells provided within each row of each said at least one memory array such that said width of each said at least one memory array in said second direction is said integer multiple of the row height.

14. A method as claimed in claim 11, wherein:
the memory instance comprises at least one memory array and a plurality of logic circuits coupled to said at least one memory array;
in said integration enhancement mode of operation of the memory compiler, the memory compiler constrains the width of said plurality of logic circuits in said second direction to be an integer multiple of the row height.

15. A method as claimed in claim 11, wherein:
the memory instance comprises at least one memory array, a plurality of logic circuits coupled to said at least one memory array, and a plurality of edge cells;
in said integration enhancement mode of operation of the memory compiler, the memory compiler selects a width of the edge cells in said second direction such that the width of the desired memory instance in said second direction is constrained to be an integer multiple of the row height.

16. A storage medium storing a memory compiler computer program for controlling a computer to generate a desired memory instance from a memory architecture associated with the memory compiler computer program, the memory architecture specifying a definition of circuit elements and data defining rules for combining those circuit elements, the memory compiler computer program having an integration enhancement mode of operation in which, during performance of a method of generating a layout of an integrated circuit, where the layout incorporates standard cells defining functional components of the integrated circuit and at least one memory instance defining a memory device of the integrated circuit, the memory compiler computer program is configured to reference at least one property of a standard cell library defining said standard cells in order to generate the desired memory instance in a form that will reduce an area overhead associated with a boundary between that desired memory instance and surrounding standard cells when that desired memory instance is integrated into the layout.

* * * * *